United States Patent
Colwell et al.

[11] Patent Number: 5,917,207
[45] Date of Patent: Jun. 29, 1999

[54] PROGRAMMABLE POLYSILICON GATE ARRAY BASE CELL ARCHITECTURE

[75] Inventors: Michael J. Colwell, Fremont; Teh-Kuin Lee, San Jose; Jane C.T. Chiu, Sunnyvale; Abraham F. Yee, Cupertino; Stanley Wen-Chin Yeh, Fremont; Gobi R. Padmanabhan, Sunnyvale, all of Calif.

[73] Assignee: LSI Logic Corporation, Milpitas, Calif.

[21] Appl. No.: 08/800,663

[22] Filed: Feb. 14, 1997

Related U.S. Application Data

[60] Division of application No. 08/613,038, Mar. 8, 1996, Pat. No. 5,691,218, which is a continuation-in-part of application No. 08/254,819, Jun. 6, 1994, abandoned, which is a division of application No. 08/086,487, Jul. 1, 1993, Pat. No. 5,358,886.

[51] Int. Cl.[6] .......................... H01L 21/82; H01L 27/04; H01L 27/10
[52] U.S. Cl. .......................... 257/206; 257/203; 257/202; 257/391; 257/208
[58] Field of Search .................... 257/208, 203, 257/202, 369, 206, 391, 392

[56] References Cited

U.S. PATENT DOCUMENTS

| | | | |
|---|---|---|---|
| 4,668,972 | 5/1987 | Sato et al. | 357/42 |
| 4,766,475 | 8/1988 | Kawashima | 357/40 |
| 4,920,398 | 4/1990 | Yoshio et al. | 357/42 |
| 4,992,845 | 2/1991 | Arakawa et al. | 257/206 |
| 5,019,889 | 5/1991 | Yoshio et al. | 357/42 |
| 5,087,955 | 2/1992 | Futami | 257/355 |
| 5,581,202 | 12/1996 | Yano et al. | 326/101 |
| 5,610,417 | 3/1997 | Doi | 257/202 |
| 5,691,218 | 11/1997 | Colwell et al. | 437/48 |
| 5,698,873 | 12/1997 | Colwell et al. | 257/206 |
| 5,760,428 | 6/1998 | Colwell et al. | 257/203 |

FOREIGN PATENT DOCUMENTS

| | | | |
|---|---|---|---|
| 431 490 A1 | 12/1991 | European Pat. Off. | H01L 23/485 |
| 61-208237 | 9/1986 | Japan | H01L 21/82 |
| 63-314847 | 12/1988 | Japan | H01L 21/82 |
| 64-37033 | 2/1989 | Japan | H01L 21/82 |
| 64-66950 | 3/1989 | Japan | H01L 21/82 |
| 2-275653 | 9/1990 | Japan | H01L 21/82 |
| 3-138972 | 6/1991 | Japan | H01L 27/04 |
| 5-343525 | 12/1993 | Japan | H01L 21/82 |
| 6-089988 | 3/1994 | Japan | H01L 27/118 |
| 6-089989 | 3/1994 | Japan | H01L 27/118 |
| 6-77445 | 3/1994 | Japan | H01L 27/118 |

*Primary Examiner*—Peter Toby Brown
*Assistant Examiner*—Hung Van Duong

[57] ABSTRACT

A gate array is disclosed having a programmable polysilicon layer which serves as both the gate electrodes for MOS transistors and routing lines for some connections between gate electrodes. The gate array structure is formed on a semiconductor substrate and has an array of identical base cells located in a core region of the structure. Each such base cell des the following elements: (1) a plurality of transistors, each of which includes a gate electrode; and (2) one or more gate connection strips formed on the substrate and electrically connecting selected gate electrodes of two or more of the transistors. Preferably, the gate connection strips are made from the same material as the selected gate electrodes (e.g., polysilicon) and are integrally connected therewith. The gate connection strips may patterned (i.e., programmed) to form substrate level routing between gates of various transistors.

20 Claims, 7 Drawing Sheets

PROGRAMMABLE POLYSILICON GATE ARRAY BASE CELL ARCHITECTURE

CROSS REFERENCE TO RELATED APPLICATIONS

This application is a division of Ser. No. 08/613,038 filed Mar. 8, 1996, now U.S. Pat. 5,691,218 dated Nov. 25, 1997 which is continuation-in-part of Ser. No. 08/254,819 filed Jun. 6, 1994, now abandoned, which is division of Ser. No. 08/086,487 filed Jul. 1, 1993, now U.S. Pat. No. 5,358,886 dated Oct. 25, 1994. The contents of both application Ser. No. 08/254,819 and U.S. Pat. No. 5,358,886 are incorporated herein by reference for all purposes.

This application is also related to pending U.S. patent application Ser. No. 08/613,040 (attorney docket no. LSI1P041 P-2695) filed on the same day as the instant application, and naming Michael J. Colwell and Teh-Kuin Lee as inventors, and entitled "HIGH DENSITY GATE ARRAY BASE CELL ARCHITECTURE". That application is incorporated herein by reference for all purposes.

BACKGROUND OF THE INVENTION

The present invention relates generally to complementary metal oxide semiconductor ("CMOS") gate array structures. More particularly, the invention relates to a base cell design for use in such gate array structures.

A gate array is a type of integrated circuit ("IC") made from an array of repeating identical base cells in a core region of a semiconductor chip. Each such base cell contains the same predetermined number and arrangement of MOS transistors. And, as in all MOS-based ICs, each such transistor includes two source/drain diffusion regions separated by a channel region in a silicon substrate, together with a gate located over the channel region. Each gate includes a thin layer of gate oxide sandwiched between a polysilicon gate electrode and the channel region of the substrate.

A gate array masterslice structure contains no prespecified circuitry, only unwired MOS transistors which will later be wired to one another to form circuit elements. Thus, a transistor level gate array structure provides the flexibility to form many different types of integrated circuits—such as for example memory chips and logic chips. The ultimate design of such gate array integrated circuits is determined by the back-end processing employed (i.e., the processing to form and pattern metallization layers and thereby create wiring between the many transistors available on the underlying base cells). It is the arrangement of these interconnections that defines the circuitry present on a given gate array integrated circuit. Because of their versatility, gate arrays are widely used to make application specific integrated circuits (ASICs).

Figure 1A:
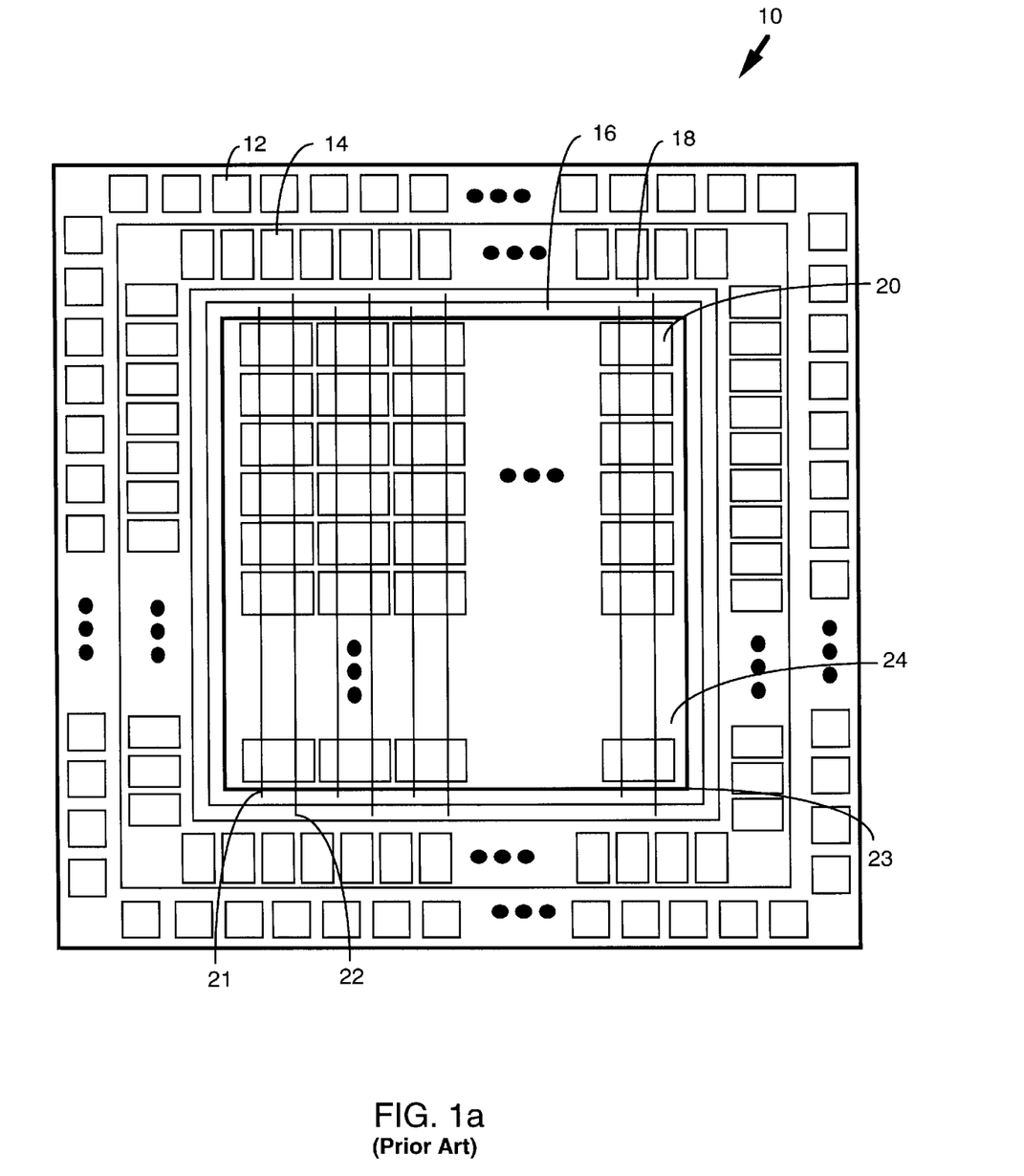
FIG. 1a is an illustration of a conventional gate array masterslice containing an array of repeating base cells in a core region.

FIG. 1a shows a basic gate array structure 10 provided on a semiconductor die 23 and including a core region 24 containing an array of identical base cells such as base cell 20. As shown, the base cells are generally rectangular and are arranged in repeating rows and columns. Within each base cell, a collection of transistors (not shown) is provided. In each column of base cells within the core region 24, a first metal line 21 and another first metal line 22 span the length of the core region. Metal line 22 is used to deliver power (Vdd) to individual base cells in the column of the array, while metal line 21 provides ground (Vss) to each base cell in the column. Gate array 10 also includes Vdd metal line 18 and Vss metal line 16 ringing the core perimeter to provide power and ground to the metal lines 22 and 21.

The gate array structure 10 also includes input/output ("I/O") pads 12 and I/O slots 14 located around the perimeter of the die 23 and outside of the core region 24. These pads form the contact region for wire bonds or other electrical connections that connect the IC circuitry to external elements. The I/O slots 14 contain transistors and other devices used for interfacing with the external elements to which die 23 is connected. Typically slots 14 will provide such functions as Electrostatic Discharge (ESD) protection, predrivers, and input and output buffers, etc.

Figure 1B:
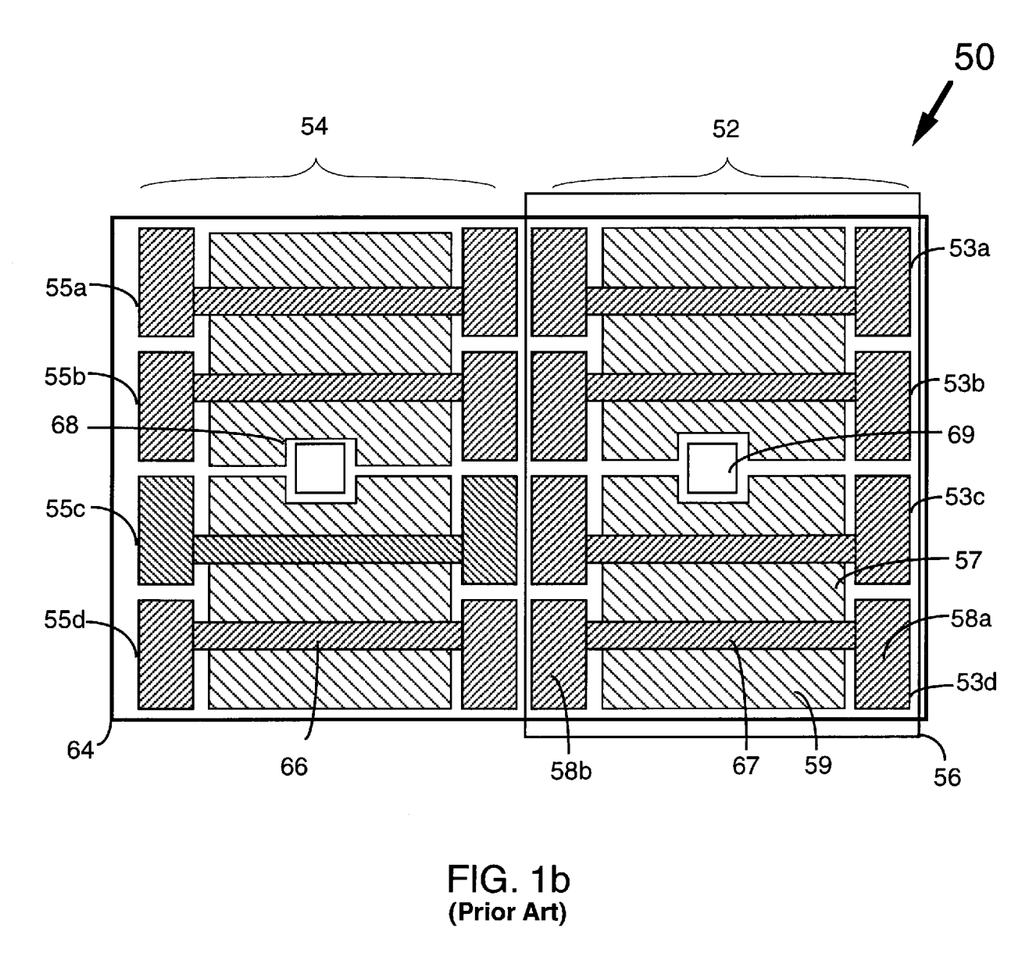
FIG. 1b is an illustration of a transistor layout for a prior art base cell used in gate arrays.

One suitable base cell design for gate arrays has been developed and used by LSI Logic Corporation of Milpitas, California (assignee of the present invention). This design employs 8 MOS transistors: 4 n-type and 4 p-type, all of approximately the same size, and is illustrated in FIG. 1b. As shown, a base cell 50 (corresponding to base cell 20 in FIG. 1a for example) is formed on a p-type substrate 64, and includes an n-type transistor side 54, and a p-type transistor side 52. The p-type transistor side 52 includes an n-well 56, in which four p-type transistors 53a–53d, all aligned in parallel with a single axis, are formed. As shown, each p-type transistor is identically sized and shaped. Some or all of these transistors will form circuits after they are wired to one another and/or other transistors by back-end processing.

Focusing on the p-type transistor 53d, a polysilicon gate electrode 67 is provided between a source diffusion region 59 and a drain diffusion region 57. Also, the gate electrode 67 terminates in two polysilicon contacts ("poly-heads") 58a and 58b. A tap 69 is provided between transistors 53b and 53c to provide contact to a Vdd power line.

The n-type transistor side 54 includes four n-type transistors 55a–55d, all aligned parallel with the transistors of p-type transistor side 52. As shown in n-type transistor 55d, for example, a gate electrode 66 of similar size and shape to gate 67 is provided. Further, a tap 68 is provided between n-type transistors 55b and 55c to provide contact to a Vss ground line.

Gate array designs as shown in FIGS. 1a and 1b should be contrasted with "cell based" designs. Cell based designs generally employ, in the chip's core region, many different base cells, as opposed to a single repeating base cell. Typically, the various base cells have different sizes, shapes, transistor arrangements, etc., and they are laid out in a manner chosen for a given integrated circuit design. Because the base cell choice and arrangement is dictated by the integrated circuit design, cell based designs generally use available chip space more efficiently than gate array designs. However, cell based technology is often unsuitable for use with ASICs which are manufactured in insufficient volume to recoup the additional development costs generally associated with the cell based design process. Thus, gate array designs will continue to find widespread use in ASIC designs.

Gate array designers face a continuing challenge of simplifying on-chip routing. To the extent that they meet this challenge they increase the chip space utilization and, at the same time, reduce the fabrication process complexity. Routing refers to the electrical connections made on ICs between individual transistors to form circuitry. Such connections are made with conductive vertical interconnects between transistors at the IC substrate level and metallization layers sitting above the substrate. Dielectric layers electrically insulate the metallization layers from one another and from the substrate. Each such metallization layer is patterned to form various metal lines that electrically link device elements from multiple transistors and thereby form the IC's circuitry. The complexity of modem gate arrays typically requires at least two and often more metallization layers.

Unfortunately, each additional metallization layer adds significantly to the cost and complexity of fabricating the gate array.

Much of the routing in any gate array design functions to define the individual circuits that make up the IC. Such circuits may be simple logic gates such as NAND gates as well as more complex circuitry such as multiplexers and flip flops with multiple inputs. In addition to such basic circuit-level routing, ICs also employ a certain amount of "chip-level routing" which connects the various circuits together to form a functioning IC. Such chip-level routing is made up of metallization lines that may have to cross many base cells. To the extent that circuit-level routing occupies space on a given metallization level, that space is unavailable for chip-level routing. In fact, if the circuit-level routing occupies too much space it may be necessary to employ another metallization layer for some or all of the chip-level routing. Thus, gate array designs that reduce the amount of circuit-level routing at the first and second metallization levels can significantly reduce the cost of an IC.

Figure 1C:
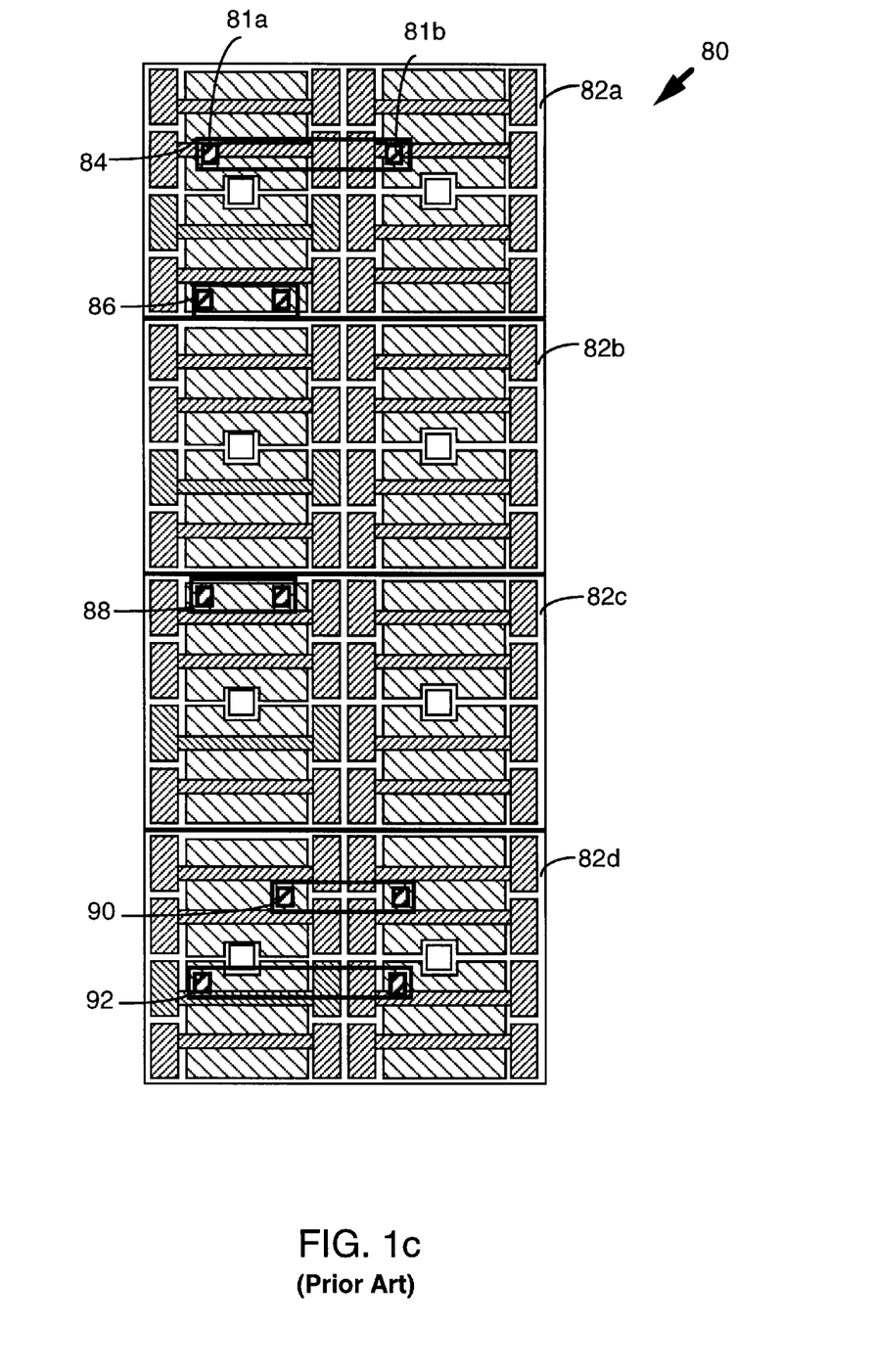
FIG. 1c is an illustration showing how a complex circuit (a flip flop in this case) can require jumpers at the second metallization layer in order to wire the circuit.

For illustration purposes only, FIG. 1c shows a plurality of base cells 80 having individual base cells 82a–82d. The first metallization layer (metal-l) is not shown in order to illustrate how circuit-level routing is typically implemented a second metallization layer (metal-2). If a complex flip flop circuit, for example, is constructed on the plurality of base cells 82a–82d, the metal-1 interconnects could not in themselves completely wire the flip flop. Thus, metal-2 jumpers 84, 86, 88, 90 and 92 are required to complete the necessary transistor interconnections. Via contacts such as contacts 81a and 81b that are used to provide interlayer connections. As shown, metal-2 jumpers 84, 86, 88, 90 and 92 leave much of the room on the left and central regions of the base cells unavailable for chip-level routing. In some instances, more metallization lines must be formed from a third metallization layer (metal-3).

In view of the above example and the general need to reduce the number of steps in gate array fabrication, it would be desirable to provide a gate array masterslice that reduces the amount of circuit-level routing in the first and/or second metallization levels.

SUMMARY OF THE INVENTION

The present invention fills this need by providing a gate array having a programmable polysilicon layer which provides polysilicon transistor interconnections at the level of the semiconductor substrate. As a result, some routing lines from the gate array metallization layers are moved to the polysilicon layer (a "first level" below the first metallization layer) on the substrate, thereby reducing the number of lines dedicated to circuit routing on the overlying metallization layers. Thus, more area is available for chip level routing on the metallization levels.

In one aspect, the present invention provides a gate array structure formed on a semiconductor substrate and having an array of identical base cells located in a core region of the structure. Each such base cell may be characterized as including the following elements: (1) a plurality of transistors, each of which includes a gate electrode; and (2) one or more gate connection strips formed on the substrate and electrically connecting selected gate electrodes of two or more of the transistors. Preferably, the gate connection strips are made from the same material as the selected gate electrodes (e.g., polysilicon) and are integrally connected therewith. The gate connection strips may be patterned (i.e., programmed) to form substrate level routing between gates of various transistors.

While the use of gate connection strips can be applied to any base cell design, in one preferred embodiment, it is applied to a base cell having four transistors of a first conductivity type and four transistors of a second conductivity type (i.e., four transistor are p-type and four are n-type). Furthermore, of the four first conductivity type transistors, at least one set of two transistors are connected in series and share a source/drain region. Preferably, a second set of two first conductivity type transistors are also connected in series. A tap for connecting a power line or a ground line to the substrate is provided between the two sets of first conductivity transistors. The same arrangement also applies to the four second conductivity type transistors.

In a second aspect, the present invention provides a method of fabricating a gate array having the structure described above by (1) forming an array of identical base cells having the structure described above including gate connection strips electrically connecting selected gate electrodes of the base cell transistors; and (2) patterning the gate connection strips to maintain electrical connection between at least two of the selected gate electrodes. In preferred embodiments, the gate electrodes, patterned gate connection strips, and diffusion regions are silicided to improve conductivity. After siliciding, the following steps are performed: (1) forming a first metallization layer over a portion of the core region; and (2) patterning the first metallization layer to form electrical connections between at least some of the transistors. Thereafter, the method may include the following additional steps: (3) forming a second metallization layer over at least a portion of the first metallization layer; and (4) patterning the second metallization layer to provide further electrical connections between at least some of the transistors. After all metallization steps are completed, the resulting die may packaged to produce a desired gate array integrated circuit.

The features and advantages of this invention will be further described below in the detailed description with reference to the associated figures.

BRIEF DESCRIPTION OF THE DRAWINGS

FIG. 4 is a flowchart diagram illustrating a method of making a gate array IC from a base cell design of the type illustrated in FIG. 2a.

DETAILED DESCRIPTION OF THE PREFERRED EMBODIMENTS

1. Base Cell Layout

Figure 2A:
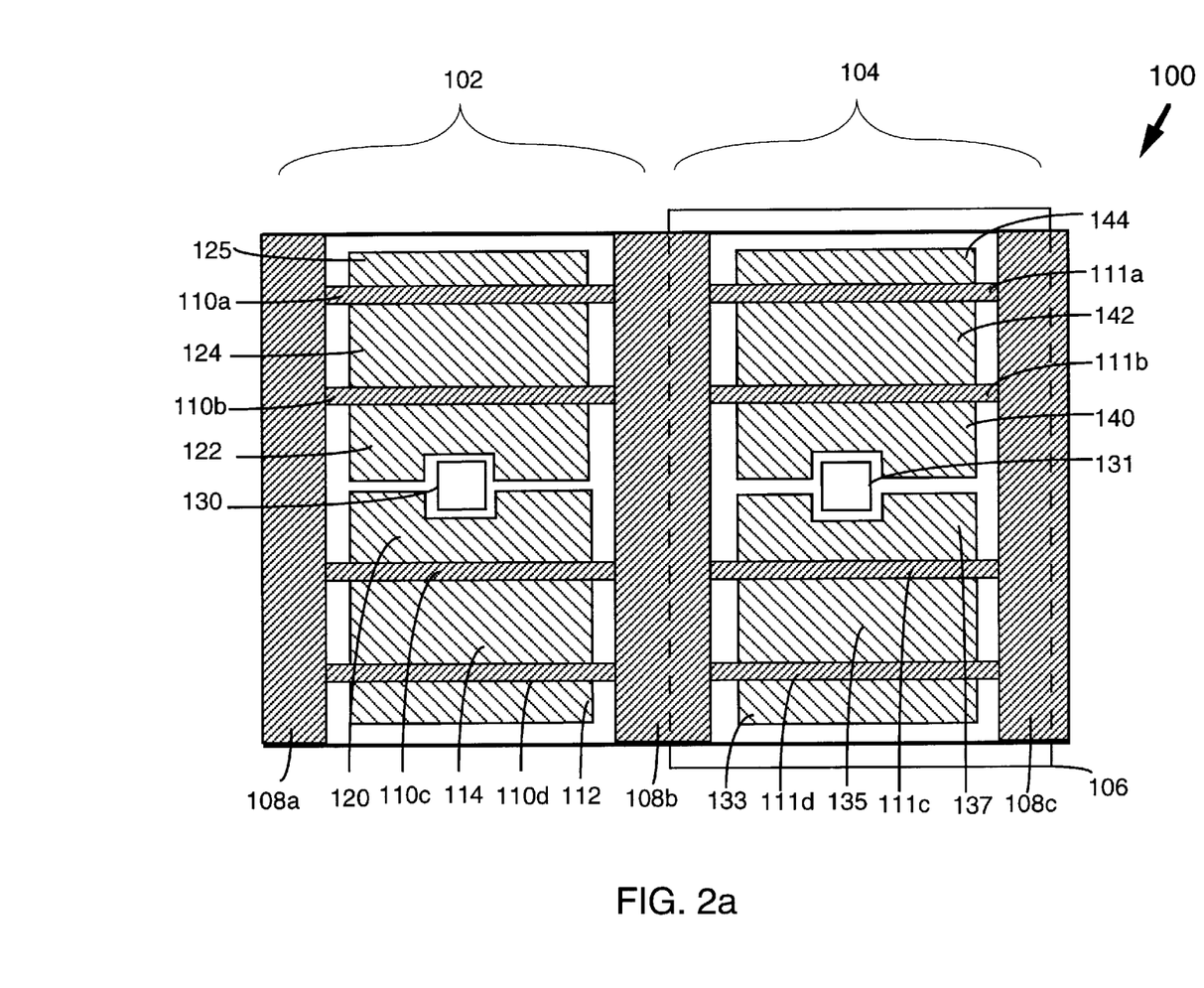
FIG. 2a is an illustration of a base cell design of the present invention including eight transistors having eight gate electrodes connected to one another by polysilicon connection strips.

The structure and use of a gate array masterslice in accordance with the present invention will now be described with reference to FIGS. 2a, 2b, 3, and 4. FIG. 2a shows a base cell 100 formed on a p-type semiconductor substrate and having a first group of transistors 102 which are NMOS devices, and a second group of transistors 104 which are PMOS devices. The second transistor group 104 PMOS transistors are formed in an n-type well 106. Also shown are four polysilicon gate electrodes 110a–110d for the first transistor group 102 and four more polysilicon gate electrodes 111a–111d for the second transistor group 104. These various gate electrodes are electrically connected to one another by "unprogrammed" polysilicon gate connection strips 108a–108c of the masterslice. They are subsequently programmed (patterned) to form some "first level" circuit routing. This is, of course, not possible with the base cell 50 shown in FIG. 1b in which the polysilicon heads straddling gate electrodes are not connected to their adjacent gate electrodes.

Typically, the gate connection strips employed in the present invention are formed in the same process step as the polysilicon gate electrodes such that together the gate electrodes and the gate connection strips form a continuous monolithic structure. Stated another way, the gate connection strips 108a–108c are integrally connected to the transistor gate electrodes of first group 102 and second group 104.

Focusing now on the first group of transistors 102, a first MOS transistor includes an n-type source/drain diffusion region 112, an n-type source/drain diffusion region 114, polysilicon gate electrode 110d, and a gate dielectric (not shown) underlying the gate electrode. A second transistor in the first group is connected in series with the first transistor through source/drain region 114, which acts as a source/drain for the second transistor. In addition, the second transistor includes an n-type source/drain diffusion region 120, gate 110c, and an underlying gate dielectric (not shown). Further, the first group of transistors 102 includes a second set of transistors connected in series. Specifically, a third transistor includes an n-type drain diffusion region 122, an n-type source diffusion region 124, gate 110b, and an underlying gate dielectric (not shown). The source/drain region 124 serves as a source/drain for a fourth transistor of the first group. In addition, that transistor includes an n-type source diffusion region 125, gate 110a, and an underlying gate dielectric (not shown).

A tap contact 130 resides between the two sets of two transistors and includes a region of high concentration p-type dopant in the p-type silicon substrate to act as an ohmic contact for a ground (Vss) line (not shown). As discussed above with reference to FIG. 1a, a Vss line formed from a first metallization layer provides ground contacts to many individual base cells in a base cell column of the gate array. It is this Vss line that provides contact to ground by interconnecting with tap 130. A corresponding tap 131 is provided in the second group of transistors 104 to contact with a power (Vdd) line (not shown). Like tap 130, tap 131 includes a region of increased dopant concentration (n-type in this case) in the n-well to provide an ohmic contact with the Vdd line.

The transistors of the second group 104 mirror the transistors in the first group 102, but are of the opposite type (i.e., they are PMOS transistors). Within second group 104, a first transistor includes a p-type drain diffusion region 133, a p-type source/drain diffusion region 135, the gate 111d, and an underlying gate dielectric (not shown). A second transistor of the second group 104 includes a diffusion region 137 as a source/drain region, p-type source/drain diffusion region 135, gate 111b, and an underlying gate dielectric (not shown). Thus, the first and second transistors of group 104 are connected in series through diffusion region 135.

A second set of transistors in the group 104 includes a third transistor having a p-type source/drain diffusion region 140, a p-type source/drain diffusion region 142, gate 111b and an underlying gate dielectric (not shown).. The diffusion region 142, in turn, acts as a source/drain region for a fourth transistor, such that the third and fourth transistors in the second group 104 are also connected in series. The fourth transistor also includes a diffusion region 144, and gate electrode 111a.

In the first transistor group 102, gate connection strips 108a and 108b provide an electrically conductive connection between gates 110a–110d. Likewise, in the second transistor group 104, gate connection strips 108c and 108b provide an electrically conductive connection between gates 111a–111d. It should be noted that gate connection strip 108b also provides an electrical connection between the gate electrodes of first and second transistor groups 102 and 104. As can be seen, this is possible because the gate connection strips span the length of the base cell and are oriented generally perpendicular to the gate electrodes. Further, when considering base cell 100 as one cell among rows and columns of repeating base cells of a gate array structure, the gate electrodes of transistors in adjacent base cells will also be integrally connected to each other by means of the gate connection strips 108a, 108b and 108c. As will be become apparent below these features allow the gate connection strips to be patterned to form routing lines between various gate electrodes in the base cell.

In a specific preferred embodiment, the NMOS gate electrodes of the base cell have a gate width of about 5.6 μm, while the PMOS gate electrodes have a gate width of 6.2 μm (not including any material in the gate connection strips). The gate length of both p-type and n-type transistors is 0.40 μm. As is well known to those skilled in the art, metal line interconnections of a gate array are arranged with reference to a grid spacing on the base cells. The grid spacing of this specific embodiment is about 1.4 μm by 1.4 μm, which allows for increased routing density. A single base cell includes 13 grid points (18.20 μm) in the X direction and 8 grid points (11.20 μm) in the Y direction, therefore the base cell area is 203.84 microns square.

Power and ground are supplied to circuits laid out on base cells by metal-1 lines (not shown) spanning the base cell from top to bottom and overlying taps 131 and 130. Specifically, in the first group of transistors 102, a ground line (Vss) makes contact with tap 130 and may also make various source/drain diffusion region contacts. Further, in the second group of transistors 104, a power line (Vdd) makes contact with tap 131 and may also make contact with various source/drain diffusion regions. It should be understood that such power and ground lines form segments of lines that typically span entire columns of base cells in the gate array as illustrated by lines 22 and 21 in FIG. 1a. In a specific preferred embodiment, power lines Vdd and ground lines Vss are about 1.4 μm in width, with Vdd metal lines connected to a 3.3 volts power source.

Figure 2B:
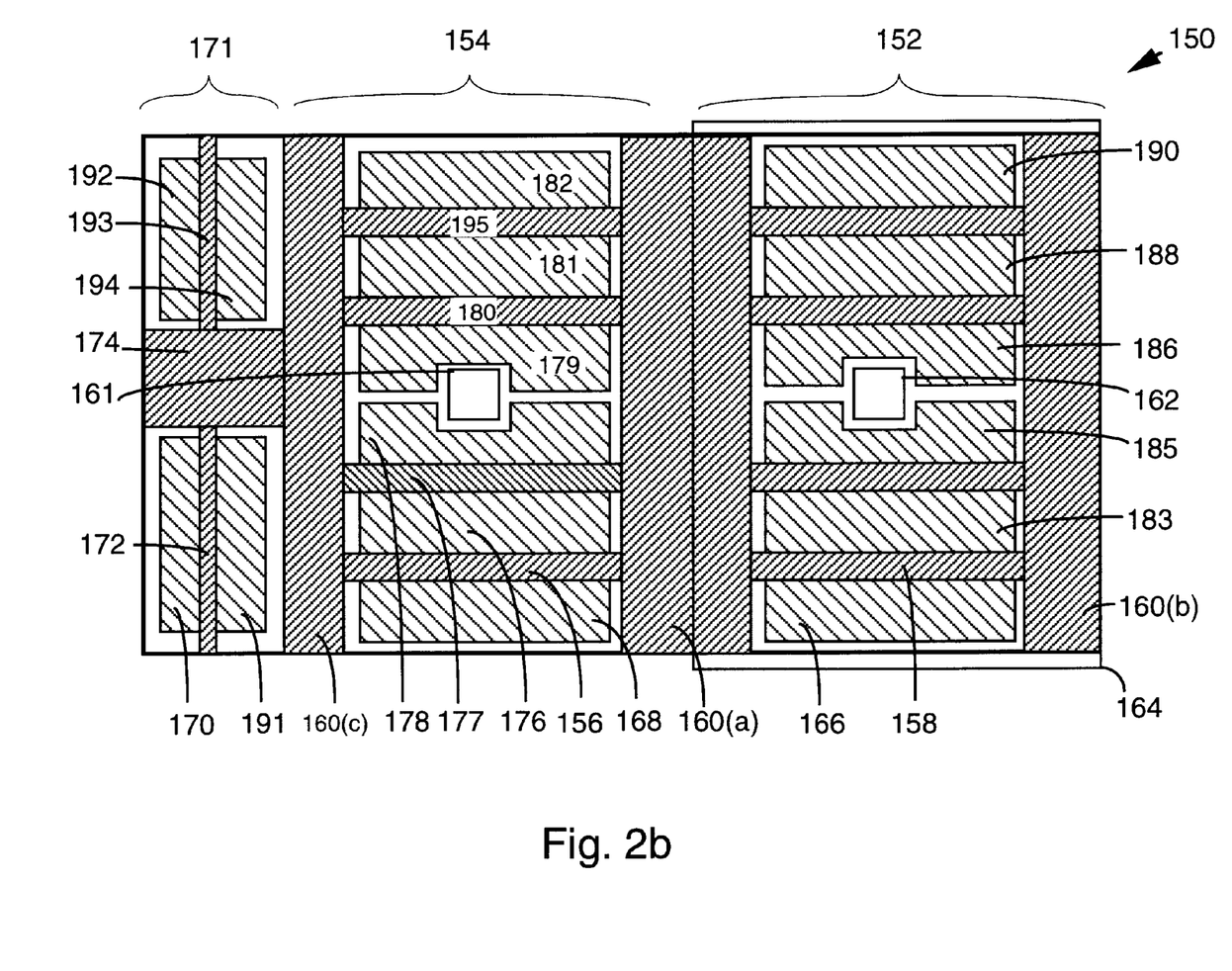
FIG. 2b is an illustration of a base cell design of the present invention including ten transistors having ten gate electrodes connected to one another by polysilicon connection strips.

FIG. 2b shows a second preferred embodiment of the present invention. A base cell 150 formed on a p-type semiconductor substrate has a first group of transistors 154 which are n-type, a second group of transistors 152 which are p-type, and a third group of transistors 171 which are n-type. The second transistor group 152 includes four PMOS transistors formed in an n-type well 164. The first transistor group 154 includes four NMOS transistors, and the third transistor group 171 includes two more NMOS transistors. The transistors of the third group differ from the transistors of the first and second groups primarily in their size and orientation within the base cell 150. As shown, the transistors of third group 171 have a substantially shorter gate width than the transistors of first and second groups 154 and 152. This base cell layout is particularly useful in those circuit designs that can employ one or more small transistors.

A gate connection strip 160(a) connects the transistors of the first and second groups and extends to the edges of the base cell 150 in the direction perpendicular to the gate widths of the transistors in those groups. A gate connection strip 160(b) connects the transistors of the second group to one another and to adjacent base cells on three sides of base cell 150. A gate connection strip 160(c) connects the four transistors of the first group to one another and to two adjacent base cells. Finally, a gate connection strip 174 connects the third group transistors to one another, to one adjacent base cell, and to gate connection strip 160(c).

Focusing now on the first group of transistors 154, a first MOS transistor includes an n-type source/drain diffusion region 168, an n-type source/drain diffusion region 176, and a gate 156. A second transistor in the first group is connected in series with the first transistor through source/drain region 176, which also acts as a source/drain for the second transistor. In addition, the second transistor includes an n-type source/drain diffusion region 178 and a gate 177. Further, the first group of transistors 154 includes a second set of transistors connected in series. Specifically, a third transistor includes an n-type source/drain diffusion region 179, an n-type source/drain diffusion region 181, and a gate 180. The source/drain region 181 also serves as a drain for a fourth transistor of the first group. In addition, that transistor includes an n-type source/drain diffusion region 182 and a gate 195.

Finally, within the first group of transistors 154, a tap contact 161 resides between the two sets of two transistors and includes a region of high concentration p-type dopant in the p-type silicon substrate to act as an ohmic contact for a ground (Vss) line (not shown). A corresponding tap 162 is provided in the second group of transistors 152 to contact with a power (Vdd) line (not shown). Like tap 161, tap 162 includes a region of increased dopant concentration (n-type in this case) in the n-well to provide an ohmic contact with the Vdd line.

The transistors of the second group 152 mirror the transistors in the first group 154, but are of the opposite type (i.e., the second group transistors are p-type transistors). Specifically, a first transistor within second group 152 includes a p-type source/drain diffusion region 166, a p-type source/drain diffusion region 183, and a gate 158. A second transistor of the second group 152 includes diffusion region 183 as a source/drain region, a gate, and a p-type source/drain diffusion region 185. Thus, the first and second transistors of group 152 are connected in series through diffusion region 183. A second set of transistors in the group 152 includes a third transistor having p-type source/drain diffusion region 186, a gate, and a p-type source/drain diffusion region 188. The diffusion region 188, in turn, acts as source/drain region for a fourth transistor, such that the third and fourth transistors in the second group 152 are connected in series. The fourth transistor of the second group also includes a gate and a source/drain diffusion region 190.

Finally, the third group of transistors 171 includes a first NMOS transistor having source/drain diffusion regions 170 and 191 separated by a gate 172. Group 171 also includes a second NMOS transistor having source/drain regions 192 and 194 separated a gate 193. The gates of the two NMOS transistors of the third group 171 are connected to one another by gate connection strip 174.

There are various distinctions between the transistors of the third group 171 and the remaining transistors of the first and second groups. For example, unlike the transistors of the first and second groups, the two transistors of the third group 171 are not connected in series. Further, the transistors of the third group are oriented substantially perpendicular to the transistors of the first and second groups. That is, the transistors of the first and second groups all have gates that are aligned in parallel with a first axis, and the transistors of the third group all have gates that are aligned in parallel with a second axis that is substantially perpendicular to the first axis. This conserves space in the base cell. If the transistors of the third group 171 are not used in an integrated circuit, the space over these transistors serves as a convenient routing path for conductive lines on the first metallization layer. Thus, for some designs, all or most circuit level routing can be completed on the first metal layer (metal-1). This increases available second level metal (metal-2) routing possibilities by reducing the need for metal jumpers on metal-2.

The relatively small size of the transistors of the third group also has certain advantages. To the extent that a circuit can utilize such transistors, the circuit will have a lower capacitance because the gate capacitance of the smaller transistors is less than the gate capacitance of the larger transistors in the first and second groups. Further, the smaller transistors draw less current and therefore may require smaller current carrying lines, thereby further conserving space on the resulting integrated circuit, and increasing the usable gate density significantly.

In a specific preferred embodiment, gate electrodes of transistors in the first group 154 (e.g., gate electrode 156) have gate widths of about 5.7 μm, while gate electrodes of transistors in the second group 152 (e.g., gate electrode 158) have gate widths of 5.9 μm. The shorter gate electrodes of transistors in the third group 171 (e.g., gate electrode 193) have gate widths of only about 3.65 μm. In this embodiment, the gate widths do not include the width of the polysilicon heads (e.g., poly heads 160a and 160b). The gate length of both p-type and n-type transistors is 0.40 μm. As is well known to those skilled in the art, metal line interconnections of a gate array are arranged with reference to a grid spacing on the base cells. The grid spacing of this specific embodiment is about 1.4 μm by 1.4 μm, and a single base cell includes 15 grid points (21 μm) in the X direction and 8 grid points (11.20 μm) in the Y direction. The base cell area is therefore 235.20 microns square.

Figure 3:
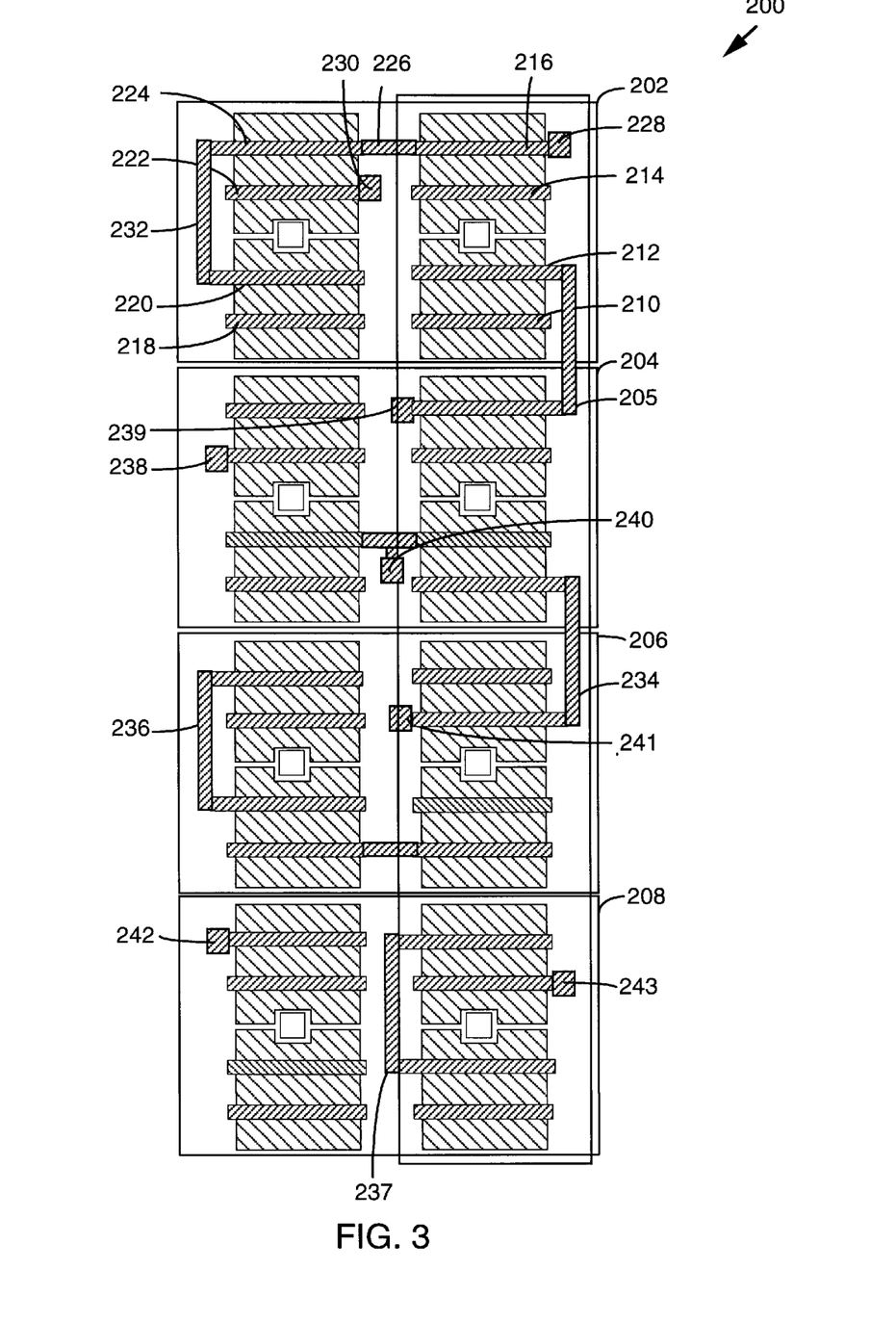
FIG. 3 is an illustration showing how the polysilicon connection strips can be programmed (patterned) to provide circuit-level routing at the polysilicon level of the gate array.

FIG. 3 illustrates a first level (i.e., the polysilicon level) of a gate array masterslice after the gate connection strips have been patterned to form first level routing among selected gate electrodes in four contiguous base cells 200. While not representing any specific circuit, it is conceivable that the polysilicon structures shown in FIG. 3 are similar to those that would be employed in a flip flop, multiplexer or other circuit that requires multiple transistor interconnection over multiple base cells.

The array section 200 consists of four representative base cells 202, 204, 206, and 208. In each base cell, NMOS transistors are provided on the left side and PMOS transistors are provided on the right side. Thus in base cell 202 for example, polysilicon gate electrodes 218, 220, 222 and 224 are employed in NMOS transistors, and polysilicon gate electrodes 210, 212, 214 and 216 are employed in PMOS transistors.

Suppose that a circuit design required a connection between gate electrode 224, and gate electrode 220. Then a polysilicon connection line 232 could be formed by patterning one of the gate connection strips. Similarly, if the circuit design required a connection between gate electrodes 224 and 216, a polysilicon connection line 226 could be formed from another gate connection strip. As should be apparent, such routing is normally implemented at the metal-i layer. By moving such routing to the polysilicon layer, substantial space may be freed for, e.g., chip level routing, and usable gate density may be increased.

To the extent that a connection is required between gate electrodes of adjoining base cells, the present invention allows such connections to be made at the polysilicon level. For example, polysilicon lines 205, 234, 236, and 237 provide such connections. Of course, not all connections to gate electrodes can be completed at the polysilicon level. In such cases, a vertical contact must extend from a metal-1 line to the underlying polysilicon level. To safely provide enough room for such contacts—consistent with applicable design rules—polysilicon "port areas" may be formed from the gate connection strips. Such ports are illustrated polysilicon structures 228, 230, 238, 239, 240, 241, 242, and 243. Note that poly-port 240 is formed on a polysilicon line connecting an NMOS transistor gate electrode and a PMOS transistor gate electrode of base cell 204.

Unlike the base cell shown in FIG. 1b, unnecessary polysilicon heads are not left on the base cell. This provides the advantage of reduced gate capacitance and consequently improved performance.

2. Method of Fabricating Programmable Polysilicon Gate Arrays

Figure 4:
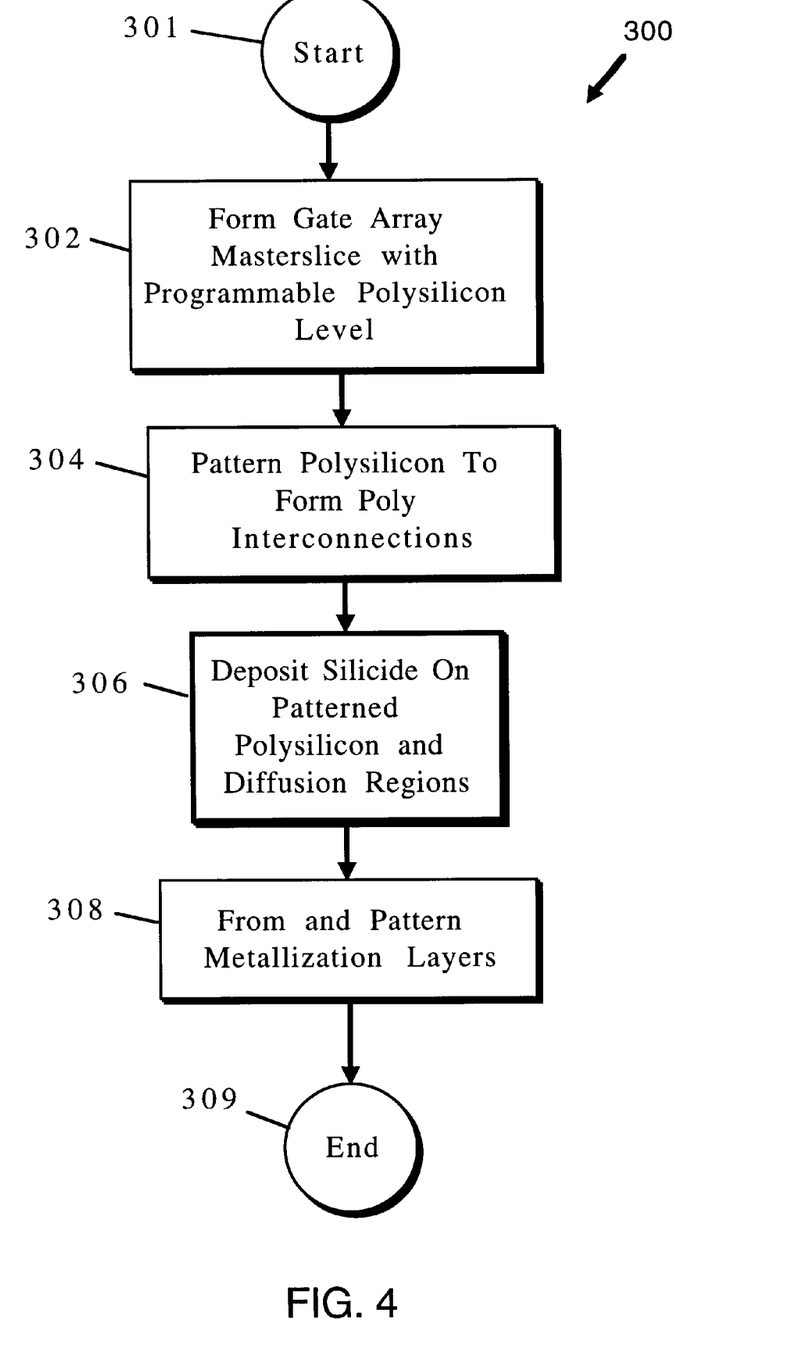

A general process flow 300 for fabricating gate array integarated circuits in accordance with this invention is set forth in FIG. 4. The process begins at 301 and in a step 302, a gate array masterslice is formed. The masterslice will have a programmable polysilicon level as illustrated in the base cell of FIG. 2a. After this structure is formed, the polysilicon level—specifically the collection of polysilicon gate connection strips—is patterned at a step 304 to form some polysilicon level routing lines between gate electrodes of neighboring transistors. Thereafter, at a step 306, a layer of silicide is deposited on the patterned polysilicon and diffusion regions to improve the conductivity of the resulting structure. Finally, one or more metallization layers as appropriate are formed and patterned at a step 308. The process is concluded at 309.

Two features of this process are particularly noteworthy. First, the step of patterning polysilicon to form polysilicon level routing (step 304) is not found in conventional gate array fabrication processes. This step requires an extra mask and etch step, but provides the advantage of eliminating some circuit-level metallization lines and associated vertical contacts. At the very least, this will free up space on the metal-1 layer for additional routing. It may also eliminate the need for an entire metallization layer, a savings that far outweighs the additional cost of the polysilicon patterning step. The other feature of note in process 300 is the silicide step 306. This improves the conductivity of the various MOS device components.

Like most IC fabrication processes, the process of fabricating gate arrays of invention generally can be divided into "front end" steps and "back end" steps. Front end steps generally include those steps necessary to form the actual transistor elements such as source/drain regions, gates, and isolation regions. Back end steps generally include those process steps necessary to create circuitry by wiring the various transistors formed by the front end processing. As applied to gate arrays, front end processing produces the array of repeating base cells having the transistor layout described above, while back end processing produces the wiring to form circuits from the base cell transistors.

In front end processing, device active regions initially are formed and electrically isolated on a single crystal semiconductor substrate. Sometime thereafter, a gate oxide layer is formed on the substrate, and then a polysilicon layer is formed on the gate oxide layer (typically by CVD deposition). The resulting polysilicon layer is doped by ion implantation, masked, and etched to form gate electrodes and gate connection strips. The resulting gate electrode/gate connection strip layout is characterized by an array of repeating base cells, each having a base cell layout following the design set forth in FIG. 2a, for example. After the gates have been formed, source/drain regions are formed by two or more ion implantation steps. At least one of these steps will form n-type source/drain regions of NMOS devices and the other implant will form p-type source/drain regions of PMOS devices. Typically, the NMOS transistor regions will be masked during the p-type implant and the PMOS transistor regions will be masked during the n-type implant. In this manner, the p- and n-type transistor groups are formed separately in the base cells. At this point, step 302 of process 300 has been completed. Thereafter, the polysilicon layer is patterned at step 304 as described above.

After the source/drain regions have been formed, a silicide is formed on top of the polysilicon and substrate to create less resistive regions (step 306). Finally a passivation layer of, e.g., borophosphosilicate glass ("BPSG") is deposited over the entire gate array structure. At this point, the front end processing is complete and the gate array structure has been partially wired by virtue of patterning step 304.

The back end process steps of relevance to this invention will now be described. Collectively, these steps constitute step 308 of process 300. Initially, a contact mask is formed on the passivation layer to define contact regions to device elements on the substrate and to the associated polysilicon gate electrodes. Thereafter, the passivation region is etched (typically by a plasma etch) to form vertical contact holes through the passivation layer to level 1 (the underlying substrate and polysilicon). At this point, a diffusion barrier layer (sometimes referred to as a "glue" layer) made of a material such as a titanium nitride layer is formed to protect the device elements adjacent the contact holes from ingress of metal atoms from a subsequently deposited metallization layer. In some processes, the contact holes are filled with tungsten plugs according to procedures known in the art. Regardless of whether tungsten plugs are formed, a blanket deposition of a first metallization layer is performed. The first (and all subsequent) metallization layers may be made from various metals used in the industry such as aluminum (Al), aluminum copper (AlCu), or aluminum silicon copper (AlSiCu). These layers are conventionally deposited by sputtering, as is well known in the industry.

After the first metallization layer has been deposited, it is patterned to form lines connecting various device elements.

The exact layout of the lines will be determined by the particular ASIC design. The patterning is done by first depositing a mask such as a photoresist and then exposing it to light to define the pattern of metal lines to be created in a subsequent etch step. Thereafter, the underlying first metallization layer is etched by a plasma process such as reactive ion etching (RIE).

After the first metallization layer has been etched, the photoresist is removed and a dielectric layer is deposited over the first metallization layer in order to insulate this metallization layer from the next successive metallization layer (i.e., the second metallization layer). Typically, oxide or borophosilicate glass are used as the dielectric layer, but other dielectrics such as a nitride or polyimide films (which can be laid on by spinning) may also be used. The dielectric layer is then planarized by any appropriate technique. After a dielectric layer has been formed and planarized as described, a via mask is formed on the dielectric layer's upper surface. The via mask will define vias or regions where interconnects between the first and second metallization layers are to be formed. Thereafter, another plasma assisted etch is performed to create the actual vias in the dielectric layer. After the formation of the vias in the dielectric, the next metallization layer (metal-2) is deposited and patterned as described above.

In some cases, it may be necessary to form and pattern one or more additional metallization layers to complete the wiring of the gate array IC. However, because at least some of the interconnections will be completed at the polysilicon level, the total number of metallization layers may be less than normally expected as a direct result of practicing this invention.

3. Conclusion

Although the preferred embodiments of the present invention has been described in detail, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. A gate array structure formed on a semiconductor substrate and having an array of identical base cells located in a core region of the structure, each such base cell comprising:
a plurality of transistors, each of which includes a gate electrode, said plurality of transistors including
a first group of transistors of a first conductivity type, each having a first gate width,
a second group of transistors of a second conductivity type, opposite said first conductivity type, each transistor of said second group having a second gate width that is substantially equal to the first gate width, and
a third group of transistors of said first conductivity type, each having a third gate width which is smaller than the first and second gate widths, wherein the transistors of the first and second groups all have gates that are aligned in parallel with a first axis, and the transistors of the third group all have gates that are aligned in parallel with a second axis that is substantially perpendicular to the first axis; and
one or more gate connection strips formed on said substrate and electrically connecting selected gate electrodes of two or more of said transistors.

2. The gate array structure of claim 1, wherein the gate connection strips are made from the same material as the selected gate electrodes and are integrally connected therewith.

3. The gate array structure of claim 2, wherein the gate connection strips and the gate electrodes are comprised of polysilicon.

4. The gate array structure of claim 1, wherein at least one of the gate connection strips is aligned substantially perpendicular to at least one of the gate electrodes.

5. The gate array structure of claim 1, wherein first group of transistors consists of four transistors and the second group of transistors consists of four transistors.

6. The gate array structure of claim 1, wherein the transistors of the first group of transistors contain at least one set of two transistors which are connected in series and share a source/drain region.

7. The gate array structure of claim 1, further including a tap for connecting a power line or a ground line proximate the transistors of the first conductivity type.

8. The gate array structure of claim 1, wherein the second group of transistors contains at least one set of two transistors which are connected in series and share a source/drain region.

9. The gate array structure of claim 1, further including a tap for connecting a power line or a ground line proximate the second group of transistors.

10. The gate array structure of claim 1, wherein the transistors of the first group of transistors are NMOS transistors, and wherein a tap is provided proximate the first group of transistors for connecting to a Vss metal line, and a tap is provided proximate the second group of transistors for connecting to a Vdd metal line.

11. A gate array structure formed on a semiconductor substrate and having an array of identical base cells located in a core region of the structure, each such base cell comprising:
a plurality of transistor means, each of which includes a gate electrode at a first level above the substrate but below any metallization layers; and
means for electrically connecting selected gate electrodes of two or more of said transistors, said means for electrically connecting selected gate electrodes being located at said first level, wherein said plurality of transistor means includes (i) a first group of transistor means of a first conductivity type, each having a first gate width, (ii) a second group of transistor means of a second conductivity type, opposite said first conductivity type, each transistor means of said second group having a second gate width that is substantially equal to the first gate width, and (iii) a third group of transistor means of said first conductivity type, each having a third gate width which is smaller than the first and second gate widths, wherein the transistor means of the first and second groups all have gates that are aligned in parallel with a first axis, and the transistor means of the third group all have gates that are aligned in parallel with a second axis that is substantially perpendicular to the first axis.

12. The gate array structure of claim 11, wherein the gate electrodes and the means for electrically connecting selected gate electrodes are both comprised of polysilicon and are integrally connected to one another.

13. The gate array structure of claim 11, wherein said transistor means of the first group consists of four n-type transistor means and the transistor means of the second group consists of four p-type transistor means.

14. The gate array structure of claim 13, wherein the four n-type transistor means are separated into two n-type groups, each of which contains two n-type transistor means connected in series, and wherein the four p-type transistor means are separated into two p-type groups, each of which contains two p-type transistor means connected in series.

15. The gate array structure of claim 11 wherein the transistor means are at least partially covered by a layer of silicide.

16. An integrated circuit substrate, comprising:

an array of identical base cells in a core region of the substrate, each such base cell having
   (a) a plurality of transistors, with each such transistor including a gate electrode, and
   (b) at least one gate connection strip electrically formed on said substrate and connecting selected gate electrodes of two or more of said transistors; and the gate connection strip being configured to maintain electrical connection between at least two of the selected gate electrodes, wherein said plurality of transistors includes (i) a first group of transistors of a first conductivity type, each having a first gate width, (ii) a second group of transistors of a second conductivity type, opposite said first conductivity type, each transistor of said second group having a second gate width that is substantially equal to the first gate width, and (iii) a third group of transistors of said first conductivity type, each having a third gate width which is smaller than the first and second gate widths, wherein the transistors of the first and second groups all have gates that are aligned in parallel with a first axis, and the transistors of the third group all have gates that are aligned in parallel with a second axis that is substantially perpendicular to the first axis.

17. The integrated circuit substrate of claim 16, wherein the array of identical base cells have polysilicon gate electrodes that are integrally connected to the polysilicon gate connection strips.

18. The integrated circuit substrate of claim 16, wherein the first group of transistors consists of four transistors and the second group of transistors consists of four transistors.

19. The integrated circuit substrate of claim 18, wherein each of the first and second groups of transistors of the array of identical base cells contain at least one set of two transistors which are connected in series and share a source/drain region.

20. The integrated circuit substrate of claim 18, wherein a first tap of the array of identical base cells is formed proximate the first group of four transistors, and a second tap is formed proximate the second group of four transistors, one of the first and second taps provided for connecting to a power line and the other of the first and second taps provided for connecting to a ground line.

* * * * *